United States Patent
Chen et al.

(10) Patent No.: US 7,492,590 B2
(45) Date of Patent: Feb. 17, 2009

(54) COMPUTER ENCLOSURE

(75) Inventors: Yun-Lung Chen, Taipei Hsien (TW); Yu-Ming Xiao, Shenzhen (CN)

(73) Assignees: Hong Fu Jin Pecision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 48 days.

(21) Appl. No.: 11/611,134

(22) Filed: Dec. 15, 2006

(65) Prior Publication Data

US 2008/0144281 A1   Jun. 19, 2008

(51) Int. Cl.
  *H05K 7/20* (2006.01)
(52) U.S. Cl. .............. 361/695; 361/690; 361/697; 174/16.1; 174/16.3; 165/80.3
(58) Field of Classification Search .............. None
  See application file for complete search history.

(56) References Cited

U.S. PATENT DOCUMENTS

| | | | |
|---|---|---|---|
| 6,215,659 B1 * | 4/2001 | Chen | 361/695 |
| 6,343,011 B1 * | 1/2002 | Yu | 361/695 |
| 6,400,568 B1 * | 6/2002 | Kim et al. | 361/697 |
| 6,464,578 B1 * | 10/2002 | Chin et al. | 454/184 |
| 6,587,335 B1 * | 7/2003 | Nelson et al. | 361/687 |
| 6,643,131 B1 * | 11/2003 | Huang | 361/697 |
| 6,657,863 B2 * | 12/2003 | Lee et al. | 361/697 |
| 6,736,196 B2 * | 5/2004 | Lai et al. | 165/122 |
| 6,826,048 B1 * | 11/2004 | Dean et al. | 361/695 |
| 6,930,882 B2 * | 8/2005 | Broder et al. | 361/695 |
| 6,951,446 B2 * | 10/2005 | Hung | 415/213.1 |
| 7,050,300 B2 * | 5/2006 | Hein | 361/695 |
| 7,254,021 B2 * | 8/2007 | Lee et al. | 361/695 |
| 7,256,993 B2 * | 8/2007 | Cravens et al. | 361/690 |
| 7,261,516 B2 * | 8/2007 | Liang et al. | 415/213.1 |
| 7,310,228 B2 * | 12/2007 | Chen | 361/695 |
| 2006/0181846 A1 * | 8/2006 | Farmsworth et al. | 361/695 |
| 2007/0058341 A1 * | 3/2007 | Hsiao | 361/695 |
| 2008/0062641 A1 * | 3/2008 | Lai et al. | 361/695 |

* cited by examiner

*Primary Examiner*—Boris L Chervinsky
(74) *Attorney, Agent, or Firm*—Wei Te Chung

(57) ABSTRACT

A computer enclosure includes an airflow guide (10), a chassis (20) for mounting the airflow guide therein, a fan 30 mounted in the airflow guide, and a side panel (27) for covering the chassis. The chassis includes a rear panel (25) and a motherboard (21) mounted therein, a heat sink (23) is mounted on the motherboard, a plurality of openings (253) for dissipating heat and a fixing slot (251) are defined in the rear panel. The fan aligns with an area of the openings of the rear panel. The airflow guide encases the heat sink therein and includes a catch (1371) engaging in the fixing slot of the chassis. The side panel covers the chassis and abuts against the airflow guide for preventing the catch disengaging from the fixing slot.

20 Claims, 4 Drawing Sheets

COMPUTER ENCLOSURE

BACKGROUND OF THE INVENTION

1. Field of the Invention

The present invention relates to computer enclosures, and more particularly to a computer enclosure with an airflow guide therein.

2. Description of Related Art

Electronic devices in computers, such as central processing units (CPUs), generate a lot of heat during normal operation. The heat generated by the CPUs becomes greater as the speed of the CPUs becomes faster. However, the heat can deteriorate their operational stability, and damage associated electronic devices. Thus, the heat must be removed quickly to ensure normal temperature of the CPUs and other electronic devices in the computers. One solution for lowering heat of the CPU is by mounting a heat sink thereon. In order to dissipate the heat more efficiently, a cooling fan is usually mounted in a chassis of the computer.

When the temperature in the chassis is higher, the fan speed becomes greater and more noise is generated accordingly. Thus, an airflow guide is provided for assisting the heat sink to dissipate heat without increasing noise. The airflow guide is usually mounted in the chassis of the computer by screws. It is inconvenient to assemble and disassemble the airflow guide.

What is needed, therefore, is to provide a computer enclosure, that has an airflow guide conveniently mounted therein.

SUMMARY OF THE INVENTION

A computer enclosure includes an airflow guide, a chassis for mounting the airflow guide therein, a fan mounted in the airflow guide, and a side panel for covering the chassis. The chassis includes a rear panel and a motherboard mounted therein, a heat sink is mounted on the motherboard, a plurality of openings for dissipating heat and a fixing slot are defined in the rear panel. The fan resists against the rear panel and aligns with an area of the openings of the rear panel. The airflow guide encases the heat sink therein and includes a catch engaging into the fixing slot of the chassis. The side panel covers the chassis and abuts against the airflow guide for preventing the catch disengaging from the fixing slot.

Other advantages and novel features will be drawn from the following detailed description of preferred embodiment with the attached drawings, in which:

DETAILED DESCRIPTION OF THE INVENTION

Figure 1:
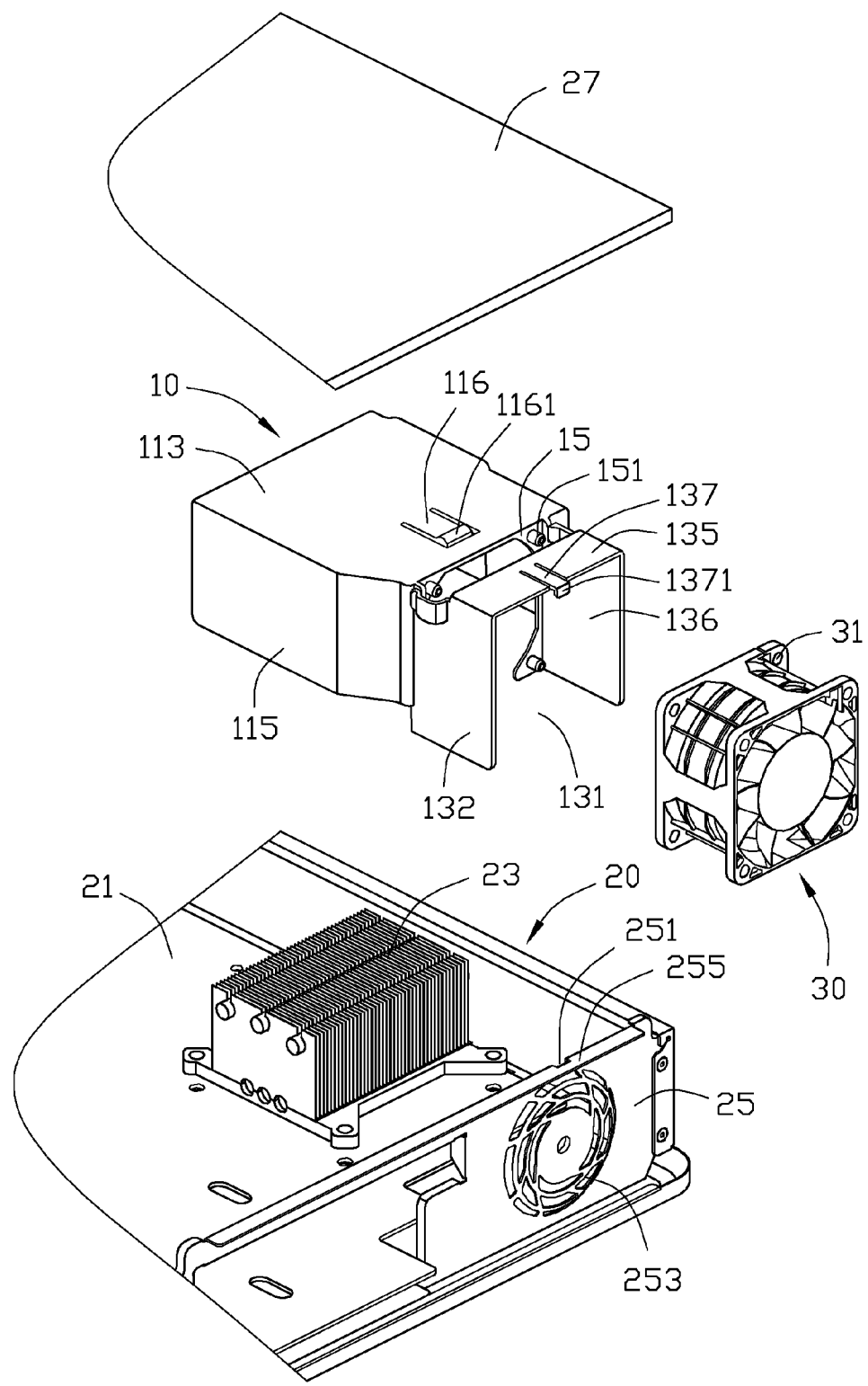
FIG. 1 is an exploded, isometric view of a computer enclosure in accordance with a preferred embodiment of the present invention including a chassis, a fan, an airflow guide, and a side panel for cover the chassis.

Referring to FIG. 1, a computer enclosure in accordance with a preferred embodiment of the present invention includes an airflow guide 10, a chassis 20 for mounting the airflow guide 10 therein, and a fan 30 mounted in the airflow guide 10.

Figure 2:
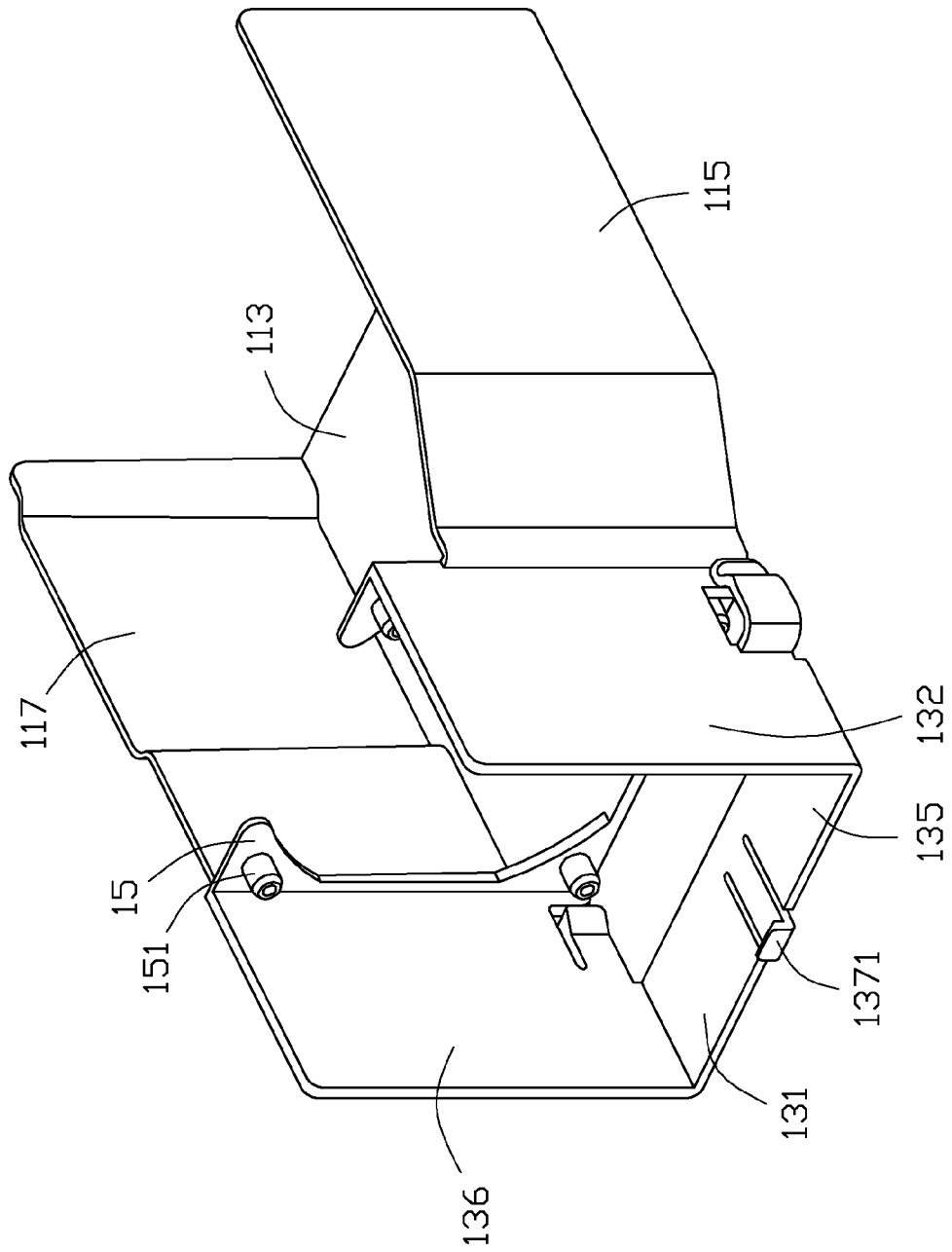
FIG. 2 is an enlarged isometric view of the airflow guide of FIG. 1, but viewed from another aspect.
Figure 3:
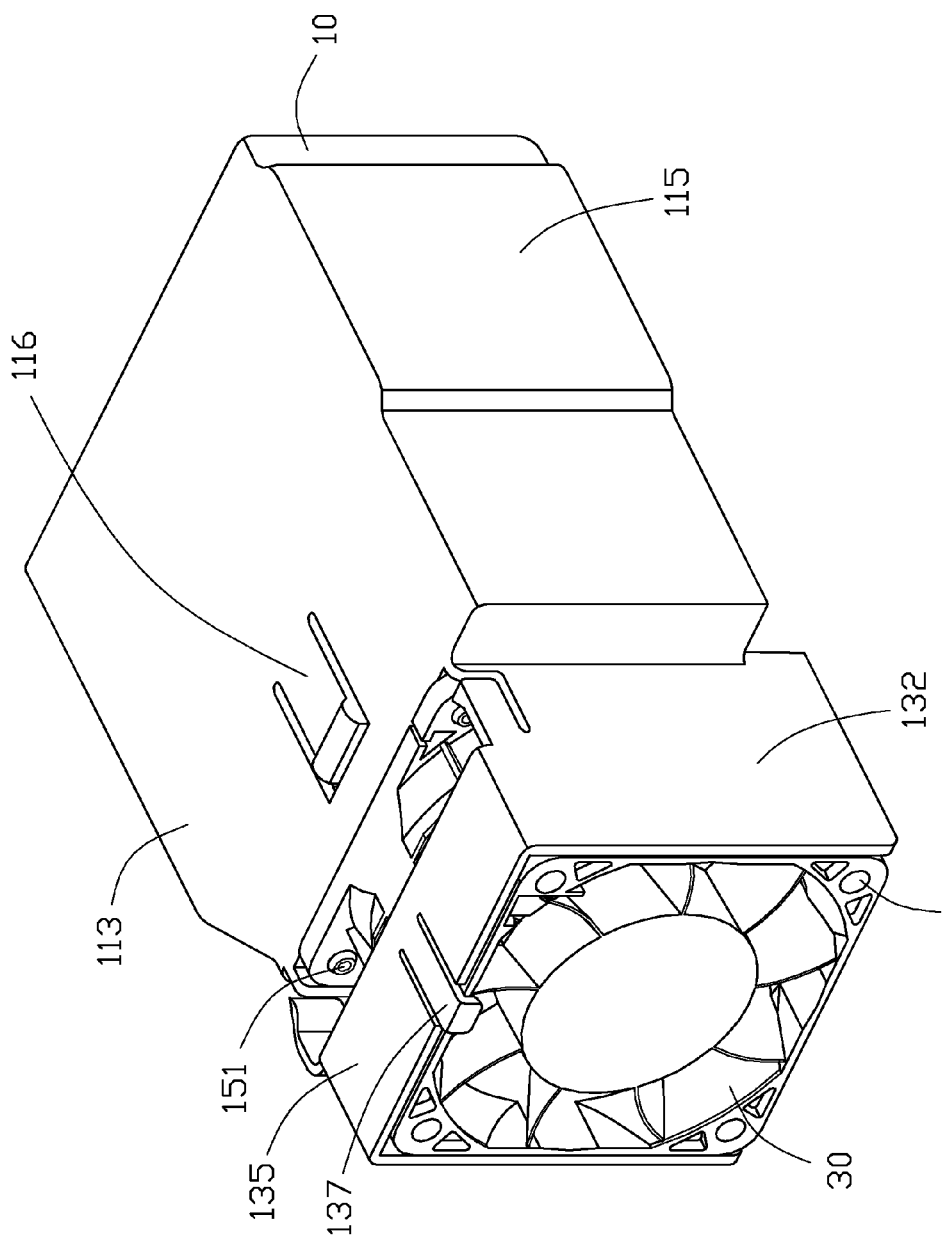
FIG. 3 is an assembled view of the fan and the airflow guide in FIG. 1.
Figure 4:
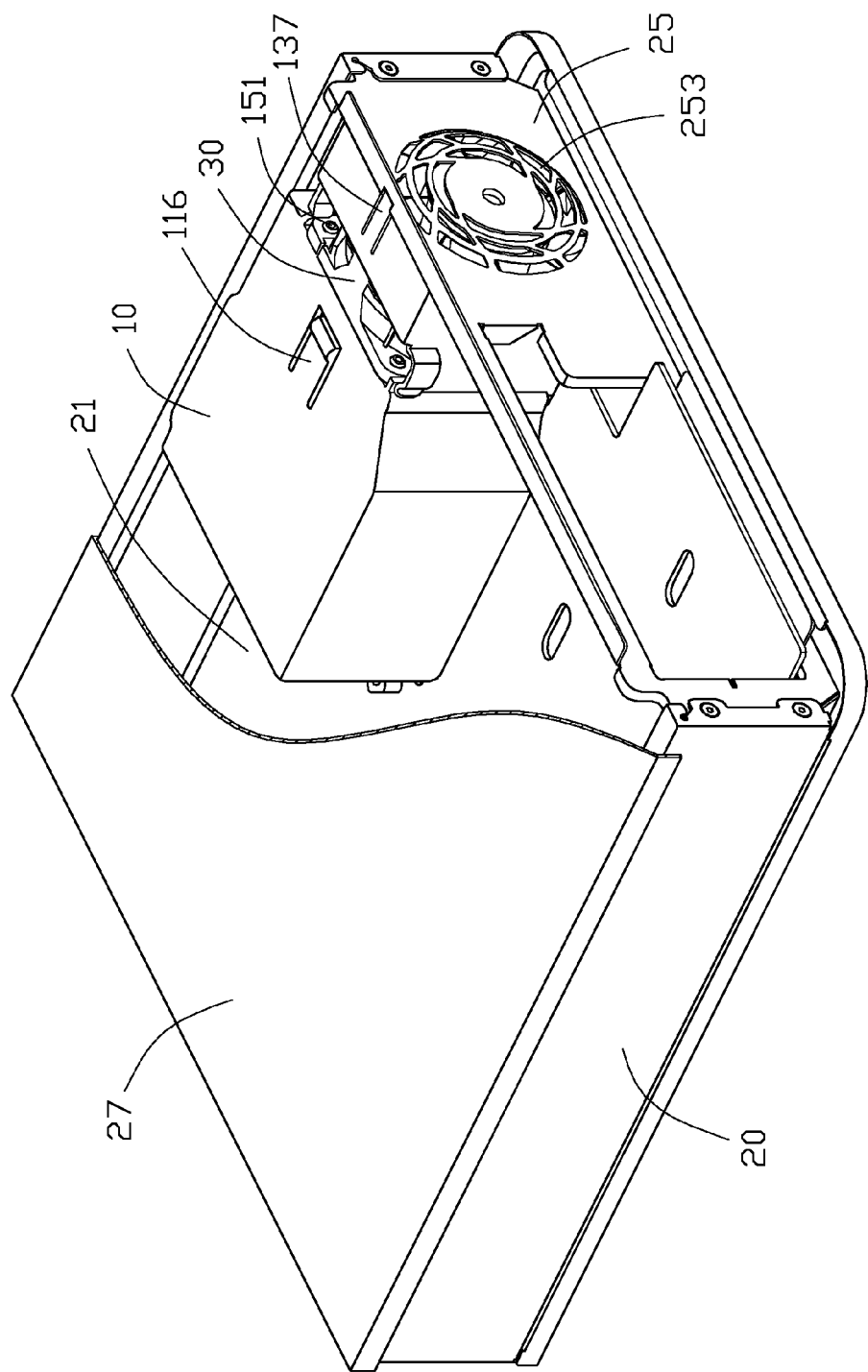
FIG. 4 is an assembled view of FIG. 1.

Referring to FIGS. 1 and 2, the airflow guide 10 includes a big second portion and a small airflow exit portion. The second portion includes a top wall 113. A first resilient piece 116 is formed in the top wall 113. A protrusion 1161 extends from a free end of the resilient piece 116. A first sidewall 115 and a second sidewall 117 extend perpendicularly from two sides of the top wall 113 respectively. The first portion includes a top wall 135. A second resilient piece 137 is formed in the top wall 135. A catch 1371 extends perpendicularly from a free end of the second resilient piece 137. A first sidewall 132 and a second sidewall 136 extend from two sides of the top wall 135. A distance between the first sidewall 132 and the second sidewall 136 of the first portion is less than that between the first sidewall 115 and the second sidewall 117 of the airflow guide portion. The top wall 135, the first side wall 132 and the second sidewall 136 configure an airflow exit opening 131. A housing space is configured by the top wall 135 and the sidewalls 132, 136 to receive the fan 30. Four triangle panels 15 extend perpendicularly and inwardly from two inner ends of the first sidewall 132 and two inner ends of the second sidewall 136 respectively. A fixing post 151 with a hole therein protrudes from each of the triangle panels 15 and points to the airflow exit opening 131.

Referring to FIG. 1, a motherboard 21 is mounted in the chassis 20 and a heat sink 23 is mounted on the motherboard 21 for dissipating heat generated by a CPU thereof. The chassis 20 includes a rear panel 25. A side panel 27 is provided as a cover for the chassis 20. A plurality of openings 253 for dissipating heat is defined in the rear panel 25. A flange 255 extends perpendicularly and outwardly from a top edge of the rear panel 25. A fixing slot 251 corresponding to the catch 1371 of the airflow guide 10 is defined in the flange 255. A width of the fixing slot 251 is equal to that of the catch 1371.

The fan 30 includes a plurality of circular holes 31 corresponding to the fixing posts 151 of the airflow guide 10 defined in two opposite sides thereof.

In assembling the fan 30 in the airflow guide 10, the fan 30 is placed in the housing space of the first portion of the airflow guide 10 until the fixing posts 151 of the airflow guide 10 extend through the circular holes 31 defined in one side of the fan 30. The second resilient piece 137 of the airflow guide 10 deforms and then comes to its original position. Thus the catch 1371 hitches another side of the fan 30 for securely mounting the fan 30 in the housing space of the airflow guide 10.

In assembly of the fan 30 and the airflow guide 10 in the chassis 20, the other side of the fan 30 aligns with an area of the openings 253 in the rear panel 25 of the chassis 20. The catch 1371 of the airflow guide 10 further engages in the fixing slot 251 of the rear panel 25 of the chassis 20. The second portion of the airflow guide 10 encases the heat sink 23. Then the side panel 27 is mounted to the chassis 20. The protrusion 1161 of the airflow guide 10 resists against the inner side of the side panel 27 to thereby allow the airflow guide 10 closely contacting with the motherboard 21, the fan 30 and the airflow guide 10 is thus firmly mounted in the chassis 20.

While the present invention has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present invention will readily appear to those skilled in the art. Therefore, the present invention is not limited to the specific details and illustrative examples shown and described.

What is claimed is:

1. A computer enclosure, comprising:
   a chassis having a rear panel and a motherboard mounted therein, a heat sink being mounted on the motherboard, a plurality of openings for dissipating heat and a fixing slot being defined in the rear panel;
   a fan aligning with an area of the openings of the rear panel;
   an airflow guide mounted in the chassis for receiving the fan and encasing the heat sink therein, comprising a catch hitching the fan and further engaging in the fixing slot of the chassis; and
   a side panel mounted on the chassis, the side panel abutting against the airflow guide for preventing the catch disengaging from the fixing slot;
   wherein the airflow guide further comprises a resilient protrusion resisting against an inner side of the side panel.

2. The computer enclosure as described in claim 1, wherein the airflow guide comprises a first portion for mounting the fan therein a second portion for encasing the heat sink, the first portion and the second portion are integrally formed together.

3. The computer enclosure as described in claim 2, wherein the first portion comprises a top wall and a pair of sidewalls extending perpendicularly from two sides of the top wall, a plurality of triangle panels extends perpendicularly from the inner ends of the side panels, a fixing post protrudes from each triangle panel.

4. The computer enclosure as described in claim 3, wherein the top panel and the side panels of the first portion configure a housing space therebetween to receive the fan.

5. The computer enclosure as described in claim 3, wherein a side of the fan defines a plurality of holes for the fixing posts engaged therein respectively.

6. The computer enclosure as described in claim 5, wherein a resilient piece is formed in the top panel of the first portion, the catch extends from a free end of the resilient piece to hitch another side of the fan and further engage in the fixing slot of the chassis.

7. The computer enclosure as described in claim 6, wherein the second portion also comprises a top wall and a pair of sidewalls extending perpendicularly from two sides of the top wall, the protrusion is formed on the top wall of the second portion and resists against the side panel for further securely mounting the airflow guide in the chassis.

8. The computer enclosure as described in claim 1, wherein a flange extends from a top edge of the rear panel of the chassis, the fixing slot is defined in the flange to allow the catch extending therethrough to abut against an outer side of the rear panel.

9. A computer enclosure, comprising:
   a chassis with a fixing slot defined therein;
   an airflow guide mounted in the chassis, comprising a plurality of fixing posts formed therein, a first resilient piece and a second resilient piece, a catch extending perpendicularly from a free end of the first resilient piece for engaging in the fixing slot of the chassis, a protrusion being rolled from a distal end of the second resilient piece;
   a fan mounted in the airflow guide, comprising a plurality of fixing holes engaging with the fixing posts of the airflow guide; and
   a side panel for covering the chassis and resisting against the protrusion of the second resilient piece of the airflow guide.

10. The computer enclosure as described in claim 9, wherein a motherboard is mounted in the chassis, a heat sink is mounted on the motherboard, the airflow guide encases the heat sink for accelerating dissipation of heat.

11. The computer enclosure as described in claim 10, wherein the airflow guide contacts with the motherboard and comprises a first portion for mounting the fan therein and a second portion connecting with the first portion for encasing the heat sink therein.

12. The lies sink as described in claim 11, wherein a topside of the second portion is farther away from the motherboard than that of the first portion and contacts the side panel.

13. The computer enclosure as described in claim 11, wherein the first resilient piece is formed in a top wall of the first portion, the catch hitches the fan and further engages in the fixing slot of the chassis.

14. The computer enclosure as described in claim 13, wherein the chassis comprises a rear panel and the fixing slot is defined in a top portion of the rear panel, the rear panel being perpendicular to the motherboard and side panel.

15. The computer enclosure as described in claim 14, wherein a plurality of openings for dissipating heat is defined in the rear panel and below the fixing slot, the fan resists against the rear panel and aligns with an area of the openings.

16. A computer enclosure comprising:
   a chassis comprising a motherboard with a heat sink arranged thereon, a panel perpendicular to the motherboard defining a vent area;
   an airflow guide attached to the panel and cooperating with the motherboard to form therebetween an airflow passage communicating with the vent area, the airflow guide comprising a resilient piece with a protrusion formed thereon and a resilient catch removably engaged with the panel, the heat sink being located at one end of the airflow passage away from the vent area;
   a fan mounted to the airflow guide and aligning with the vent area; and
   a side panel attached to the chassis, the side panel being parallel to the motherboard and abutting against the protrusion of the airflow guide toward the motherboard to prevent the resilient catch disengaging from the panel.

17. The computer enclosure as described in claim 16, wherein the airflow guide comprises a top wall spaced from the motherboard and a pair of side walls contacting with the motherboard, the airflow passage being formed between the top wall, the side walls and the motherboard.

18. The computer enclosure as described in claim 17, wherein the top wall comprises a first section on which the resilient catch is formed, and a second section on which the resilient piece is formed, the second section being farther away from the motherboard than the first section.

19. The computer enclosure as described in claim 18, wherein the panel defines a slot, and the resilient catch hitches one side of the fan to secure the fan between the first section and the side walls of the airflow guide, the resilient catch inserted into the slot to abut against an outer side of the panel.

20. The computer enclosure as described in claim 19, wherein the airflow guide further comprises a plurality of mounting panels extending perpendicularly from the side walls, posts extending from the mounting panels into holes of the fan, the catch abutting against the side of the fan toward the mounting panels.

* * * * *